US009059970B1

(12) United States Patent
Joung et al.

(10) Patent No.: US 9,059,970 B1
(45) Date of Patent: Jun. 16, 2015

(54) METHOD OF COMPRESSING AND DECOMPRESSING I/Q SAMPLE DATA IN CLOUD RADIO ACCESS NETWORK

(71) Applicant: INNOWIRELESS CO., LTD., Gyeonggi-do (KR)

(72) Inventors: Jin-Soup Joung, Gyeonggi-do (KR); Joo-Hyeong Lee, Seoul (KR); Seung-Keun Yook, Seoul (KR)

(73) Assignee: INNOWIRELESS CO., LTD. (KR)

( * ) Notice: Subject to any disclaimer, the term of this patent is extended or adjusted under 35 U.S.C. 154(b) by 0 days.

(21) Appl. No.: 14/284,448

(22) Filed: May 22, 2014

(30) Foreign Application Priority Data

Apr. 28, 2014 (KR) .......................... 10-2014-0050982
Apr. 29, 2014 (KR) .......................... 10-2014-0051770

(51) Int. Cl.
*H04B 1/66* (2006.01)
*H04L 29/06* (2006.01)

(52) U.S. Cl.
CPC ...................................... *H04L 69/04* (2013.01)

(58) Field of Classification Search
CPC . H04N 7/50; H04N 7/26244; H04N 7/26106; H04N 7/26335; H04N 7/26707; H04N 7/147; H04N 7/148; H04N 7/141; H04N 7/30; H04N 7/12; H04N 7/122; H04N 7/01; H04L 69/04; H04M 7/30
USPC ............. 375/240, 240.23, 240.25; 348/14.13, 348/384.1, 439.1
See application file for complete search history.

(56) References Cited

U.S. PATENT DOCUMENTS

| 6,384,751 | B1 * | 5/2002 | Adcock .......................... 341/106 |
| 8,842,724 | B1 * | 9/2014 | Joung et al. ................... 375/240 |
| 2009/0175360 | A1 * | 7/2009 | Soni et al. ....................... 375/241 |
| 2010/0305449 | A1 * | 12/2010 | Wegener et al. .............. 600/459 |
| 2010/0331689 | A1 * | 12/2010 | Wegener ........................ 600/443 |
| 2011/0135013 | A1 * | 6/2011 | Wegener ........................ 375/241 |
| 2012/0207206 | A1 * | 8/2012 | Samardzija et al. ........... 375/240 |
| 2012/0250740 | A1 * | 10/2012 | Ling ............................... 375/219 |

OTHER PUBLICATIONS

Related KR application: KR 10-2013-0052642, filed May 9, 2013; Applicant: Innowireless Co., Ltd., et al. (foreign priority application of U.S. Appl. No. 13/903,356, filed May 28, 2013.

* cited by examiner

*Primary Examiner* — Khanh C Tran
(74) *Attorney, Agent, or Firm* — Kaplan Breyer Schwarz & Ottesen. LLP

(57) ABSTRACT

Provided is a method for compressing and decompressing I/Q sample data in a cloud radio access network (CRAN) that uses a fixed compression ratio and also determines a bit to be removed according a magnitude of an absolute value of the I/Q sample data when the I/Q sample data transmitted and received between a digital unit (DU) and an radio unit (RU) in the CRAN is compressed and decompressed. A method for compressing I/Q sample data in the CRAN includes: calculating absolute values of all sample data in each unit block, the unit block being a basic unit of compression; determining an $S_{MAX}$, the $S_{MAX}$ being sample data having a maximum of the absolute values; extracting sample data by a predetermined number of bits; coding information about the number of bits removed from high-order or low-order bits; and adding a sign bit before or after coding the information.

7 Claims, 6 Drawing Sheets

Figure 5

| BIT No. / SAMPLE No. | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|
| 1 | 0 | 0 | 0 | 0 | 0 | 0 | 1 | 1 | 1 | 1 | 0 | 1 | 1 | 0 | 1 |
| 2 | 0 | 0 | 0 | 0 | 0 | 0 | 1 | 0 | 0 | 1 | 1 | 1 | 0 | 1 | 1 |
| 3 | 0 | 0 | 0 | 0 | 0 | 1 | 1 | 1 | 0 | 0 | 0 | 1 | 1 | 0 | 0 |
| 4 | 0 | 0 | 0 | 0 | 0 | 0 | 0 | 0 | 0 | 0 | 1 | 0 | 1 | 0 | 1 |
| 5 | 0 | 0 | 0 | 0 | 0 | 0 | 0 | 0 | 0 | 0 | 1 | 1 | 1 | 0 | 0 |
| 6 | 0 | 0 | 0 | 0 | 0 | 0 | 0 | 0 | 1 | 0 | 0 | 0 | 0 | 1 | 1 |

Figure 6

| BIT No. / SAMPLE No. | 7 | 6 | 5 | 4 | 4 | 2 | 1 | 0 |
|---|---|---|---|---|---|---|---|---|
| 1 | 0 | 0 | 1 | 1 | 1 | 1 | 0 | 1 |
| 2 | 0 | 0 | 1 | 0 | 0 | 1 | 1 | 1 |
| 3 | 0 | 1 | 1 | 1 | 0 | 0 | 0 | 1 |
| 4 | 0 | 0 | 0 | 0 | 0 | 0 | 1 | 0 |
| 5 | 0 | 0 | 0 | 0 | 0 | 0 | 1 | 1 |
| 6 | 0 | 0 | 0 | 0 | 1 | 0 | 0 | 0 |

Figure 7

| BIT No. / SAMPLE No. | 7 | 6 | 5 | 4 | 4 | 2 | 1 | 0 |
|---|---|---|---|---|---|---|---|---|
| 1 | 0 | 0 | 1 | 1 | 1 | 1 | 0 | 0 |
| 2 | 0 | 0 | 1 | 0 | 0 | 1 | 1 | 1 |
| 3 | 0 | 1 | 1 | 1 | 0 | 0 | 0 | 1 |
| 4 | 0 | 0 | 0 | 0 | 0 | 0 | 1 | 0 |
| 5 | 0 | 0 | 0 | 0 | 0 | 0 | 1 | 1 |
| 6 | 0 | 0 | 0 | 0 | 1 | 0 | 0 | 0 |

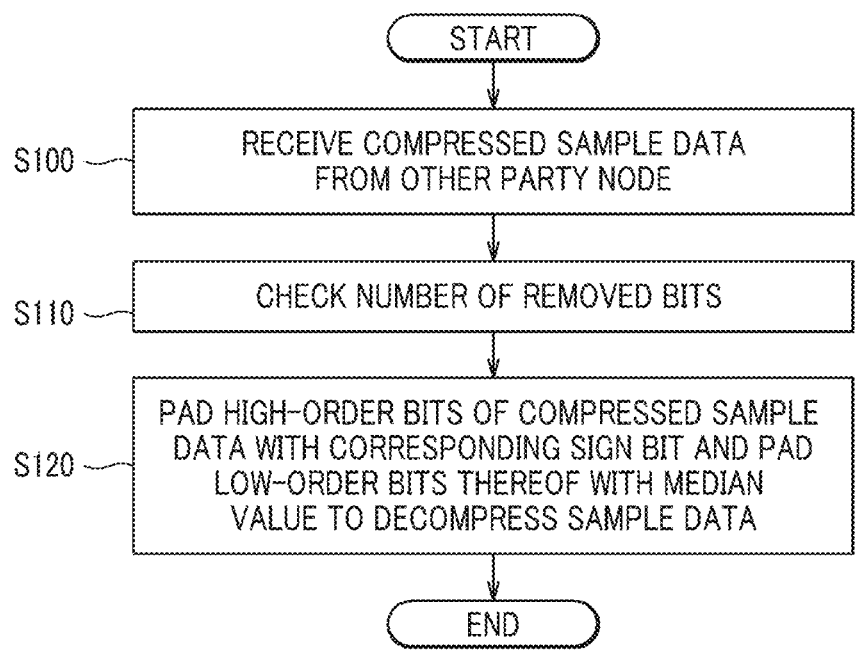

Figure 9a

| BIT No. / SAMPLE No. | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|
| 1 | 0 | 0 | 0 | 0 | 0 | 0 | 1 | 1 | 1 | 1 | 0 | 1 | 0 | 0 | 0 |
| 2 | 0 | 0 | 0 | 0 | 0 | 0 | 1 | 0 | 0 | 1 | 1 | 1 | 0 | 0 | 0 |
| 3 | 0 | 0 | 0 | 0 | 0 | 1 | 1 | 1 | 0 | 0 | 0 | 1 | 0 | 0 | 0 |
| 4 | 0 | 0 | 0 | 0 | 0 | 0 | 0 | 0 | 0 | 0 | 1 | 0 | 1 | 0 | 0 |
| 5 | 0 | 0 | 0 | 0 | 0 | 0 | 0 | 0 | 0 | 0 | 1 | 1 | 1 | 0 | 0 |
| 6 | 0 | 0 | 0 | 0 | 0 | 0 | 0 | 0 | 1 | 0 | 0 | 0 | 1 | 0 | 0 |

Figure 9b

| BIT No. / SAMPLE No. | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|
| 1 | 0 | 0 | 0 | 0 | 0 | 0 | 1 | 1 | 1 | 1 | 0 | 0 | 0 | 0 | 0 |
| 2 | 0 | 0 | 0 | 0 | 0 | 0 | 1 | 0 | 0 | 1 | 1 | 0 | 0 | 0 | 0 |
| 3 | 0 | 0 | 0 | 0 | 0 | 1 | 1 | 1 | 0 | 0 | 0 | 0 | 0 | 0 | 0 |
| 4 | 0 | 0 | 0 | 0 | 0 | 0 | 0 | 0 | 0 | 0 | 1 | 0 | 0 | 0 | 0 |
| 5 | 0 | 0 | 0 | 0 | 0 | 0 | 0 | 0 | 0 | 0 | 1 | 1 | 0 | 0 | 0 |
| 6 | 0 | 0 | 0 | 0 | 0 | 0 | 0 | 0 | 1 | 0 | 0 | 0 | 0 | 0 | 0 |

METHOD OF COMPRESSING AND DECOMPRESSING I/Q SAMPLE DATA IN CLOUD RADIO ACCESS NETWORK

CROSS-REFERENCE TO RELATED APPLICATION

This application claims priority to and the benefit of Korean Patent Application No. 10-2014-0050982, filed on Apr. 28, 2014 and Korean Patent Application No. 10-2014-0051770, filed on Apr. 29, 2014, the disclosures of which are incorporated herein by reference in their entirety.

BACKGROUND

1. Field of the Invention

The present invention relates to a method of compressing and decompressing I/Q sample data in a cloud radio access network (CRAN), and more particularly, to a method of compressing and decompressing I/Q sample data in the CRAN that uses a fixed compression ratio and also determines a bit to be removed according to a magnitude of an absolute value of the I/Q sample data when compressing and decompressing I/Q sample data transmitted and received between a digital unit (DU) and an radio unit (RU) in the CRAN.

2. Discussion of Related Art

Recently, a centralized/cloud radio access network (CRAN) structure has been widely introduced into base station systems. In the CRAN structure, a digital unit (DU) and radio unit (RU) of a base station system are separately implemented in order to reduce capital expenditure (CAPEX) and operational expenditure (OPEX) and also secure efficiency in the development of an apparatus.

In the CRAN, typically, DUs are mainly positioned in a DU center provided in a telecommunication office while RUs are installed in a service area that is spaced apart from the DU center. For high-speed transmission and reception of baseband I/Q signals, DUs and RUs are physically connected by an optical link or unshielded twisted pair (UTP) cable.

At present, one of the standards that is most widely used to transmit and receive I/Q data between the DU and RU is a common public radio interface (CPRI). Further, Version 6.0 of the standard may support a maximum line bit rate of 10,137.6 Mbps.

A standard similar to the CPRI includes an open baseband remote radiohead interface (OBSAI) that is defined prior to the CPRI and an open radio interface (ORI) that is a lower standard. For convenience, the CPRI standard will be described below as an example. However, naturally, the OBSAI and ORI are not excluded.

FIGS. 1A and 1B show several connection forms that can be supported by the CPRI standard. FIG. 1A shows the simplest configuration in which one radio equipment control (REC) corresponding to the DU and one radio equipment (RE) corresponding to the RU are connected by a single CPRI link. Further, one REC and one RE may be connected by a plurality of CPRI links. FIG. 1B shows a star topology configuration in which one REC and a plurality of REs are connected by one or more CPRI links.

According to the CPRI standard, various configurations such as a chain topology, tree topology, or ring topology other than the described-above configuration may be used to connect the REC and the RE. In the CPRI standard, no method for compressing data is defined. Hereinafter, in the standard, the term "node" is used to refer to any one subsystem implemented in the REC and RE.

Korean Patent Application No. 10-2013-0052642 entitled "Method of Compressing and Decompressing I/Q Data between a DU and RU in a CRAN" (hereinafter referred to as an "earlier filed invention") was filed on May 9, 2013 by the applicant.

In the earlier filed invention, a technology is disclosed that can significantly reduce an amount of data transmitted and received between the DU and RU by setting a basic unit of compression as a group of basic frames defined in the CPRI standard, defining a header including information about a remaining amount of data, and transmitting or receiving the header for each basic unit of compression. The earlier filed invention may include setting a basic unit of compression as a basic frame group consisting of a plurality of unit blocks, performing compression at a compression ratio decided independently for each unit block, collecting a header containing information about the compression ratio of each unit block, performing Huffman encoding on the header, and transmitting the header to another party node.

However, the earlier filed invention has a limitation in that compression efficiency is low because header information is added to respective unit blocks.

Furthermore, the earlier filed invention also has other limitations in that implementational complexity is high when hardware is designed using a register transfer language (RTL) because the number of transfer bits of I/Q sample data is variably set for each unit block, and a large amount of calculation should be performed in a short time because a header for each unit block is collected and then Huffman encoded for each basic unit of compression when the I/Q sample data is compressed.

SUMMARY OF THE INVENTION

The present invention is directed to a method for compressing and decompressing I/Q sample data in a cloud radio access network (CRAN) that uses a fixed compression ratio and also determines a bit to be removed according a magnitude of an absolute value of the I/Q sample data when compressing and decompressing the I/Q sample data transmitted and received between a digital unit (DU) and a radio unit (RU) in the CRAN.

According to an aspect of the present invention, there is provided a method for compressing I/Q sample data in the CRAN, the method including: calculating absolute values of all sample data in each unit block, the unit block being a basic unit of compression; determining an $S_{MAX}$, the $S_{MAX}$ being sample data having a maximum of the absolute values; extracting sample data, by a predetermined number of bits from an effective most significant bit (MSB) of the $S_{MAX}$, with respect to the all sample data in the unit block; adding a sign bit to each sample data extracted in extracting the sample data to generate a compressed unit block; and adding information about the number of bits removed from high-order or low-order bits, to the compressed unit block and then transmitting the compressed unit block having the information added thereto to another party node.

The unit block may include small sectors, with two or more small sectors being obtained by dividing a basic frame defined in a CPRI standard.

The information about the number of removed bits may be coded using a least significant bit (LSB) of each sample data extracted in extracting the sample data.

In adding the information, the compressed unit block may be transmitted to another party node in an order of sample numbers.

According to another aspect of the present invention, there is provided a method for decompressing I/Q sample data in the CRAN, the method including: receiving information about the number of removed bits and a compressed unit block from another party node; dividing the compressed unit block by predetermined bits to generate compressed sample data; padding high-order bits and low-order bits of the compressed sample data with binary data based on the information about the number of removed bits; and adding a sign bit to a front end of the padded sample data.

The information about the number of removed bits may checked by a least significant bit (LSB) of the compressed sample data generated in dividing the compressed unit block.

In padding the high-order bits and low-order bits, the high-order bits may be padded with the same value as the sign bit, and the low-order bits may be padded with a median value.

BRIEF DESCRIPTION OF THE DRAWINGS

The above and other objects, features, and advantages of the present invention will become more apparent to those of ordinary skill in the art by describing in detail exemplary embodiments thereof with reference to the accompanying drawings, in which:

FIG. 5 is an exemplary diagram showing I/Q sample data of a unit block for illustrating a method of compressing I/Q sample data in a CRAN according to an embodiment of the present invention;

FIG. 6 is an exemplary diagram of a unit block compressed using a method for compressing I/Q sample data in a CRAN according to an embodiment of the present invention;

FIG. 7 is an exemplary diagram of a compressed unit block in which information about the number of removed bits is coded in a method for compressing I/Q sample data in a CRAN according to an embodiment of the present invention;

FIG. 8 is a flowchart illustrating a method for decompressing I/Q sample data in a CRAN according to an embodiment of the present invention; and FIGS. 9A and 9B are exemplary diagrams showing a unit block decompressed according to a method of decompressing I/Q sample data in a CRAN according to an embodiment of the present invention, which are exemplary diagrams in which low-order bits are padded with zero or a median value.

DETAILED DESCRIPTION OF EXEMPLARY EMBODIMENTS

Preferred embodiments of a method for compressing and decompressing I/Q sample data in a cloud radio access network (CRAN) will be described in detail below with reference to the accompanying drawings.

As described above, the terms "DU" and "RU" are widely used in the CRAN while the terms "REC" and "RE" are used corresponding to the digital unit (DU) and radio unit (RU) in the common public radio interface (CPRI) which is one of the interfaces used in the CRAN. Hereinafter, the present invention will be described using these terms interchangeably.

As well known, the CPRI standard may be applied to universal mobile telecommunication system (UMTS), WiMAX forum mobile system profile according to the IEEE Std 802.16-2009, evolved UMTS terrestrial radio access (E-UTRA), and other wireless standards. The present invention will be described by exemplifying E-UTRA which is a wireless interface of 3GPP long term evolution (LTE).

In the CRAN employing the CPRI standard, the DU (REC) and the RU (RE) transmit and receive user data, CPRI control & management (CPRI C&M), and synchronization information about the CPRI frame through a CPRI interface.

Figure 1A:
FIGS. 1A and 1B show several connection forms that are supported by a common public radio interface (CPRI) standard.
Figure 1B:
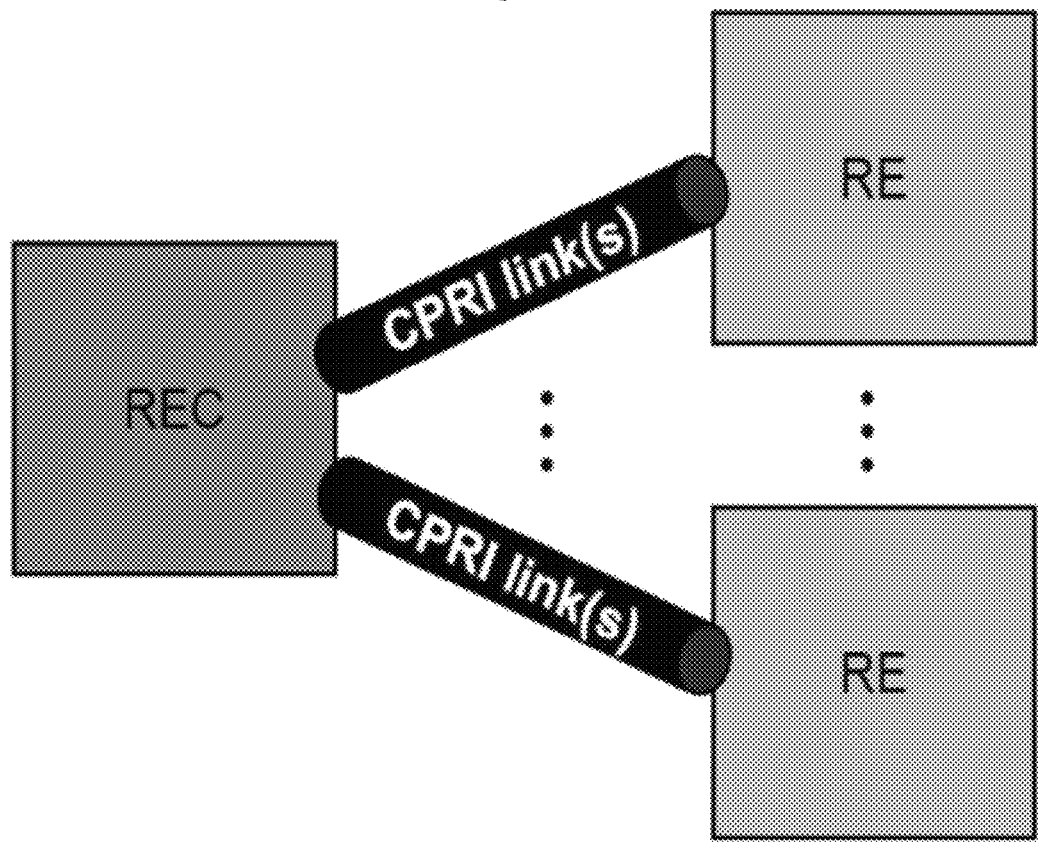
Figure 2:
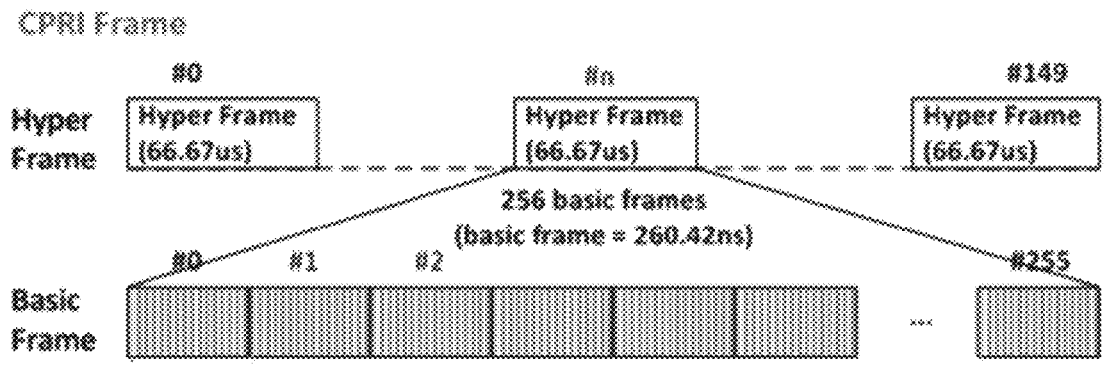
FIG. 2 is a structural diagram showing a CPRI frame and a subchannel.

FIG. 2 is a structural diagram showing a CPRI frame and a subchannel. As described in FIG. 2, one CPRI wireless frame is 10 ms in length, and each hyper frame is 66.7 μs in length because one CPRI wireless frame consists of 150 hyper frames. One hyper frame consists of a total of 256 basic frames, such that each basic frame is 260.42 ns (=1/3.84 MHz) in length.

Figure 3:
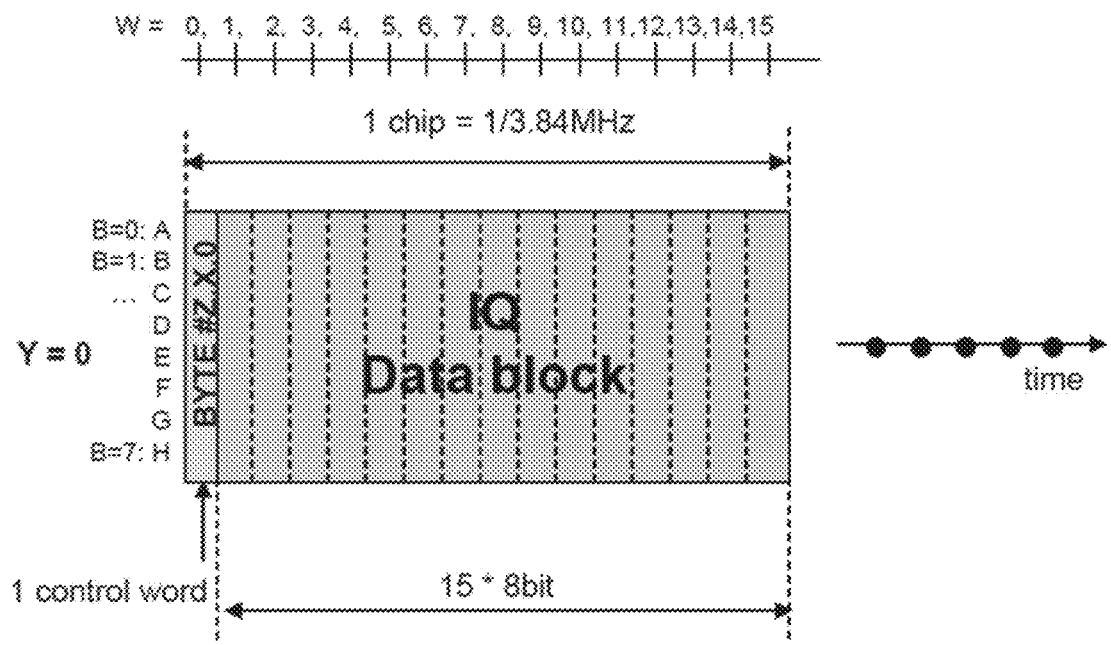
FIG. 3 is a structural diagram showing a basic frame for a CPRI line bit rate of 614.4 Mbps.

FIG. 3 is a structural diagram showing a basic frame for a CPRI line bit rate of 614.4 Mbps. As shown in FIG. 3, when user data is carried as a digital baseband IQ stream on an IQ data block within a CPRI basic frame, the RE receives the user data, converts the received data into an analog signal, amplifies the analog signal, and then propagates the amplified analog signal (to terminals) over the air. CPRI C&M data and synchronization information are delivered through a CPRI subchannel (specifically, a control word within the CPRI basic frame) and used only by the REC and RE, irrespective of the LTE layer.

Each basic frame consists of one control word and fifteen payloads, and 64 subchannels are formed by gathering a total of 256 control words in one hyper frame. The length of one word (T) of one basic frame varies depending on the line bit rate of the CPRI link, and according to CPRI ver.4.2 (released in Sep. 29, 2010), the length ranges from 8 bits (1 byte) to 128 bits (16 bytes).

In the CPRI link, one antenna-carrier (AxC) is a digital baseband user plane, that is, an amount of IQ data, which is needed to receive or transmit only one carrier in one independent antenna device. The CPRI standard supports four to twenty four AxCs for each RE. An AxC container is a portion of an I/Q data block of one basic frame. For the E-UTRA, one AxC container includes one or more I/Q samples during one UMTS chip, and this I/Q sample includes an I/Q sample bit and sometimes a stuffing bit. Here, the stuffing bit is used to align an E-UTRA sampling frequency with a basic frame frequency. The content of the stuffing bit is that of vendor rules and conditions ("v"). Table 1 is an option list for a width range of I and Q samples. Here, one IQ sample consists of one I sample and one Q sample having the same size. According to the ORI standard, which is a lower standard of the CPRI standard, the number of bits for each of the I and Q samples is defined as 15 with respect to the E-UTRA.

TABLE 1

| Direction of link | Symbol for sample width | Range [bits] |
|---|---|---|
| Downlink | M | 8, 9, 10, . . . , 20 |
| Uplink | M' | 4, 5, 6, . . . , 20 |

In a method for compressing I/Q sample data in the CRAN according to the embodiment of the present invention, a basic unit of compression may be a unit block in which two or more small sections are obtained by dividing a basic frame defined in the CPRI standard. The unit block may include four, six, or eight I or Q samples. In addition, I/Q sample data is compressed at a fixed compression ratio that is previously appointed between the DU (REC) and the RU (RE) which perform communication therebetween. For example, 15 bits, which is the number of bits for I or Q samples of the E-UTRA, are compressed into 8 bits (including a sign bit).

Figure 4:
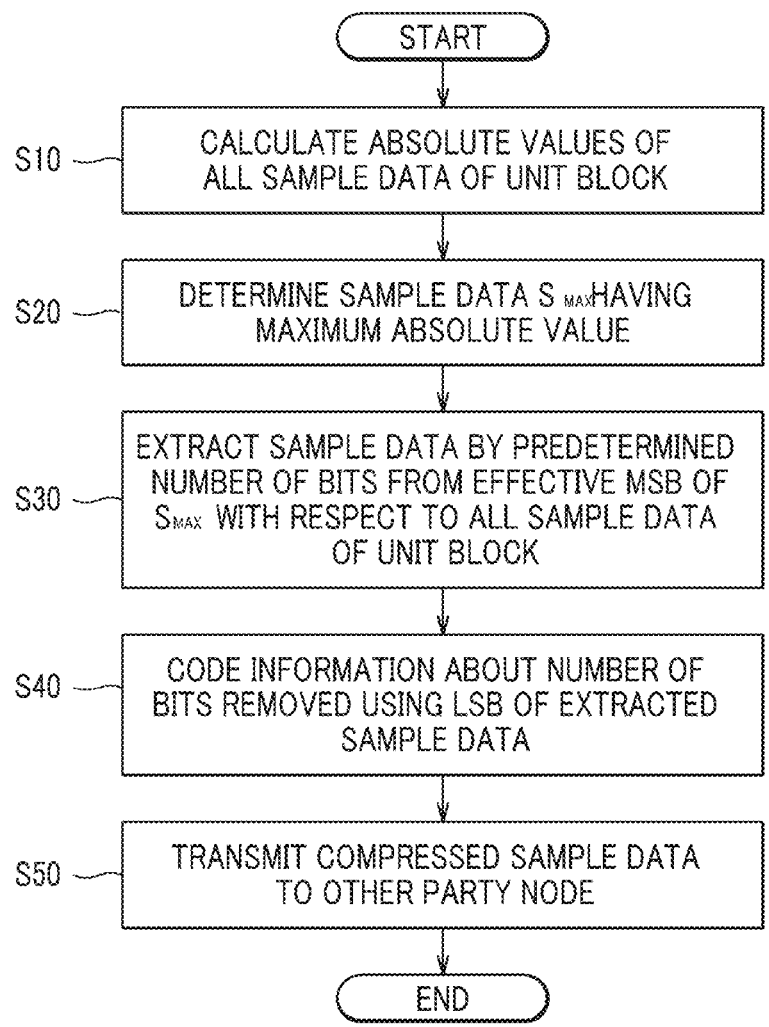
FIG. 4 is a flowchart illustrating an embodiment of a method of compressing I/Q sample data in a cloud radio access network (CRAN) according to an embodiment of the present invention.

FIG. 4 is a flowchart illustrating a method for decompressing I/Q sample data in the CRAN according to an embodiment of the present invention. As shown in FIG. 4, a method for compressing I/Q sample data in the CRAN according to the embodiment of the present invention includes calculating absolute values of all sample data for each unit block (S10) and determining $S_{MAX}$ which is sample data having a maximum value from among the calculated absolute values (S20). The present invention will be described assuming that each unit block includes six I or Q samples.

FIG. 5 is an exemplary diagram showing sample data of a unit block for illustrating a method for compressing I/Q sample data in the CRAN according to an embodiment of the present invention. As shown in FIG. 5, each unit block may consist of a total of six I or Q samples, and each sample may consist of a total of fifteen bits. In this case, an absolute value of the third sample is the greatest. Accordingly, in the unit block illustrated in FIG. 5, the third sample data is $S_{MAX}$.

Next, with respect to all sample data of the unit block, sample data is extracted by the number of bits, that is, seven bits (excluding the sign bit) from an effective MSB of the $S_{MAX}$ (S30). In the example of FIG. 5, data in a block indicated with a solid line is sample data extracted from each original sample data. Thus, according to a method of the present invention, the solid block will move more toward the high-order bit as $S_{MAX}$ is greater, and the solid line block will move more toward the low-order bit as $S_{MAX}$ is smaller. However, since the compression ratio is fixed, the size of the solid block is constant, irrespective of $S_{MAX}$.

A block as represented by the dashed line in the example of FIG. 5 indicates a high-order bit of each sample data, which is a sign bit. The sign bit is set to $0_2$ for a positive number and set to $1_2$ for a negative number. In the example of FIG. 5, the three low-order bits (the long dashed block) and the four high-order bits (the short dashed block) are removed from each sample data of 15 bits during a compression process. FIG. 6 is an exemplary diagram of the compressed unit block.

As shown in FIG. 6, the compressed unit block may include a sign bit block, which is a front-end dotted block, and a data bit block, which is a back-end solid block, extracted (S30).

Referring back to FIG. 4, the information about the number of removed bits is coded using low-order bits (LSBs) of sample data extracted (S40). In the present invention, since original sample data of fifteen bits is compressed to eight bits, the maximum number of removed bits does not exceed seven bits, such that information about the number of removed bits may be represented with a total of three bits. The information about the number of removed bits is a sum of the number of bits removed from the high-order and the low-order of the extracted sample data. If one of the two is known, the other may be calculated. Thus, the embodiment of the present invention will be described only using information about the number of low-order bits.

FIG. 7 is an exemplary diagram of a compressed unit block in which information about the number of removed bits is coded in a method of compressing I/Q sample data in the CRAN according to an embodiment of the present invention. As shown in the dashed elliptical block of FIG. 7, according to a compression method of the present invention, the information about the number of removed bits is coded using LSBs of the upper three pieces of the compressed sample data, that is, the first to third compressed sample data of the compressed unit block. Since a total of three low-order bits are removed from the unit block as shown in FIG. 5, $0_2$, $1_2$, and $1_2$ are substituted for and inserted into the LSBs of the first to third compressed sample data as information (code) about the number of removed bits, respectively.

As such, according to a method for compressing I/Q sample data in the CRAN of the present invention, it is possible to further enhance the compression ratio because the information about the number of removed bits is indicated using the LSB of the compressed sample data without a separate header.

Referring to FIG. 4 again, the generated compressed unit block is transmitted to another party node in the order of sample numbers (S50).

FIG. 8 is a flowchart illustrating a method for decompressing I/Q sample data in the CRAN according to an embodiment of the present invention. As shown in FIG. 8, according to a method of decompressing I/Q sample data in the CRAN of the present invention, first, a compressed sample data is received from another party node (S100), and the compressed sample data is carried on the compressed unit block in the order of sample numbers as described above. The information about the number of bits removed through a compression process, that is, the information about the number of low-order bits is contained in the LSBs of the upper three pieces of the compressed sample data of the received compressed unit block. According to the embodiment of the present invention, when the upper three pieces of compressed sample data of the compressed unit block is completely received, the information about the number of removed low-order bits may be determined (S110) to start decompressing the compressed sample data.

Last, the high-order bits of the compressed sample data are padded as the same value as the sign bit on the basis of the information about the number of received bits, that is, padded as $0_2$ for a positive number and $1_2$ for a negative number, and the low-order bits are padded with zero or a median value to decompress the compressed data into the I/Q sample data of 15 bits (S120).

FIGS. 9A and 9B are exemplary diagrams showing a unit block decompressed according to a method of decompressing I/Q sample data in the CRAN according to an embodiment of the present invention, which are exemplary diagrams in which less significant bits are padded with zero or a median value. As shown in FIGS. 9A and 9B, the high-order bits to be decompressed are padded with the same value as the sign bit while the low-order bits may be padded with one selected from among the median value and zero. In this case, the zero-padding or median-value-padding may be performed, including the LSB of the sample data used to code the information about the number of removed bits. Alternatively, the zero-padding or median-value-padding may be performed, excluding the LSB of the sample data used to code the information about the number of removed bits.

Table 2 shows an error vector magnitude (EVM) when the low-order bits of the sample data to be decompressed are padded with zero or the median value, which illustrates an experimental result using 27,000 samples with all conditions remaining the same, except for the padding scheme.

TABLE 2

| padding type | EVM (%) |
| --- | --- |
| zero padding | 3.096928 |
| median value padding | 2.917667 |

As it can be seen from Table 2, the EVM can be reduced by 0.179% when the median-value-padding scheme is used, compared to the zero-padding scheme. Here, the median value includes $1_2$ for the most significant bit of the low-order bit and $0_2$ for the remaining bits. That is, the median value becomes $1_2$ when 1 bit is added thereto, $10_2$ when 2 bits are added thereto, $100_2$ when 3 bits are added thereto, and $1000_2$ when 4 bits are added thereto.

According to a method of compressing and decompressing I/Q sample data in the CRAN of the present invention, it is possible to reduce implementational complexity of hardware design and perform compression and decompression in real time due to a small number of calculations if the criteria of a system are fulfilled by appropriately adjusting, in advance, a fixed compression ratio because bit data loss is inevitable but the fixed compression ratio and data is lost on relatively less significant low-order bits.

The preferred embodiment of the method of compressing and decompressing I/Q sample data in the CRAN of the present invention has been described in detail with reference to the accompanying drawings. However, the preferred embodiment is merely exemplary, and various modifications and changes are possible within the scope of the technical spirit of the present invention. Accordingly, the scope of the present invention should be determined by the following claims.

For example, instead of encoding information about the number of removed bits using LSBs of the compressed sample data, it is possible to not change the compressed sample data and add a header before a compressed unit block to transmit the header. In this case, the length of the header may be 3 bits, and when decompression is performed, it is possible to first extract the 3-bit header transmitted before the compressed unit block, check the number of removed high-order bits or low-order bits, and pad the high-order bits with zero and the low-order bits with zero or a median value based on the checked number.

In the method for compressing and decompressing I/Q sample data in the CRAN according to the embodiment of the present invention, it is possible to further enhance the compression ratio by coding information about the number of removed bits in LSBs of a plurality of sample data of a compressed unit block when compressing I/Q sample data transmitted or received between a DU and a RU in the CRAN.

Moreover, it is also possible to reduce implementational complexity of hardware design by using a fixed compression ratio and determining a bit to be removed according to a magnitude of an absolute value of sample data and also to immediately perform compression and decompression on each unit block due to a small amount of calculations.

It will be apparent to those skilled in the art that various modifications can be made to the above-described exemplary embodiments of the present invention without departing from the spirit or scope of the invention. Thus, it is intended that the present invention covers all such modifications provided they come within the scope of the appended claims and their equivalents.

What is claimed is:

1. A method for compressing I/Q sample data in a cloud radio access network (CRAN), the method comprising:
   calculating absolute values of all sample data in each unit block, the unit block being a basic unit of compression;
   determining an $S_{MAX}$, the $S_{MAX}$ being sample data having a maximum of the absolute values;
   extracting sample data by a predetermined number of bits from an effective most significant bit (MSB) of the $S_{MAX}$ with respect to all the sample data in the unit block;
   adding a sign bit to each sample data extracted in extracting the sample data to generate a compressed unit block; and
   adding information about the number of bits removed from high-order or low-order bits, to the compressed unit block and then transmitting the compressed unit block having the information added thereto to another party node.

2. The method of claim 1, wherein the unit block includes small sectors, with two or more small sectors being obtained by dividing a basic frame defined in a common public radio interface (CPRI) standard.

3. The method of claim 1, wherein the information about the number of removed bits is coded using a least significant bit (LSB) of each sample data extracted in extracting the sample data.

4. The method of claim 1, wherein, in adding the information, the compressed unit block is transmitted to another party node in an order of sample numbers.

5. A method for decompressing I/Q sample data in a cloud radio access network (CRAN), the method comprising:
   receiving information about the number of removed bits and a compressed unit block from another party node;
   dividing the compressed unit block by predetermined bits to generate compressed sample data;
   padding high-order bits and low-order bits of the compressed sample data with binary data based on the information about the number of removed bits; and
   adding a sign bit to a front end of the padded sample data.

6. The method of claim 5, wherein the information about the number of removed bits is checked by a least significant bit (LSB) of the compression sample data generated in dividing the compressed unit block.

7. The method of claim 5, wherein in padding the high-order bits and low-order bits, the high-order bits are padded with the same value as the sign bit, and the low-order bits are padded with a median value.

* * * * *